US 6,275,962 B1

(12) United States Patent
Fuller et al.

(10) Patent No.: US 6,275,962 B1
(45) Date of Patent: Aug. 14, 2001

(54) REMOTE TEST MODULE FOR AUTOMATIC TEST EQUIPMENT

(75) Inventors: Jonathan Fuller, Fremont; Charles Crapuchettes, Santa Clara; Stuart Nelson, San Jose, all of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/178,257

(22) Filed: Oct. 23, 1998

(51) Int. Cl.[7] .................................................. G01R 31/28
(52) U.S. Cl. ............................................ 714/724; 324/527
(58) Field of Search ...................... 714/724, 743, 714/731; 327/104; 324/761, 527; 709/246; 711/171

(56) References Cited

U.S. PATENT DOCUMENTS

| 4,517,512 | * | 5/1985 | Petrich et al. ........................ 714/724 |
| 4,591,795 | * | 5/1986 | McCorkle ............................. 327/104 |
| 4,730,318 | | 3/1988 | Bogholtz, Jr. et al. ................ 371/27 |
| 5,111,459 | | 5/1992 | DeVigne ................................ 371/27 |
| 5,247,246 | * | 9/1993 | Loan et al. ............................ 324/761 |
| 5,293,079 | | 3/1994 | Knoch .................................... 327/31 |
| 5,321,700 | | 6/1994 | Brown et al. ........................ 714/743 |
| 5,689,515 | * | 11/1997 | Panis .................................... 714/724 |
| 5,694,399 | * | 12/1997 | Jacobson et al. .................... 709/246 |
| 5,712,858 | | 1/1998 | Godiwala et al. .................. 371/22.1 |
| 5,752,272 | * | 5/1998 | Tanabe .................................. 711/171 |
| 5,794,175 | | 8/1998 | Conner ................................. 702/119 |

FOREIGN PATENT DOCUMENTS

| 0 566 823 A2 | 10/1993 | (EP) ............................. G01R/31/318 |
| 0 802 418 A2 | 10/1997 | (EP) ............................... G01R/1/073 |
| 0 802 418 A3 | 10/1997 | (EP) ............................... G01R/1/073 |

OTHER PUBLICATIONS

U.S. patent application No. 08/638,026, filed Apr. 26, 1996, titled "High Speed Serial Data Pin for Automatic Test Equipment", assigned to the assignee of the present invention.

SICAN Preliminary Data Sheet for 2.64 GHz Extension System for HP83000, dated May 1997.

Publication titled "Low Cost ATE Pin Electronics for Multigigabit–per–Second At–Speed Test", by Keezer et al., date unknown.

Publication titled "Multiplexing Test System Channels for Data Rates Above 1 Gb/s", by Keezer, dated 1990.

* cited by examiner

Primary Examiner—Albert Decady
Assistant Examiner—David Ton
(74) Attorney, Agent, or Firm—Lance Kreisman

(57) ABSTRACT

A remote test module is disclosed for selectively interfacing a plurality of test channels between a tester interface and a plurality of specialized pins connected to a device-under-test. The tester interface is coupled to a test controller for generating predetermined test signals. The remote test module includes a signal conditioner responsive to the test controller for modifying said predetermined test signals into module test signals and applying the module test signals to the specialized pins of the device-under-test and a connection apparatus. The connection apparatus has a plurality of conductive paths for coupling the signal conditioner between the tester interface and the specialized pins.

25 Claims, 4 Drawing Sheets

REMOTE TEST MODULE FOR AUTOMATIC TEST EQUIPMENT

FIELD OF THE INVENTION

The invention relates generally to automatic test equipment for testing integrated circuits, and more particularly a remote test module for use in an automatic test apparatus to interface with specialized pins of a device-under-test.

BACKGROUND OF THE INVENTION

The semiconductor device industry continually strives to manufacture smaller and faster integrated circuits in an effort to satisfy the insatiable demand for electronic products. In order to timely meet this demand with reliable IC's, device manufacturers are forced to verify the integrity and operability of each device. Consequently, a critical process involved in the successful manufacture of IC's relates to functional and structural test of each IC device.

To carry out the functional and structural tests of individual IC's, those skilled in the art often employ automatic test equipment. Commonly referred to as "testers", the equipment applies precisely timed signal patterns or vectors to the input pins of a device-under-test (DUT), while capturing output signals from the output pins of the DUT. The output signals are compared to expected parameters resident in a memory to determine whether the IC has any functional or structural faults.

Conventional testers typically include a computer-driven test controller that issues commands to a tester interface or test head. The test head includes pin electronics that generate and send test patterns or vectors along a plurality of signal channels coupled to the individual input and output pins of the DUT. To physically interface with the DUT, the tester interface includes an array of contacts or pogos that couple to mating contacts of a device-interface-board (DIB). The DUT mounts to a socket installed on the DIB.

While conventional testers work well for their intended purposes, advances in IC technology tend to lead advances in tester technology. For example, a trend in VLSI microprocessors involves implementing a high-speed 30 channel Rambus interface. Due to the high-frequency patterns required to drive signals through such an interface (approx. 1 Gigahertz), conventional testers have difficulty achieving the required timing accuracy of about 50 picoseconds. In this particular example, some of the inaccuracy results from impedance mismatches that occur when the pulse widths driven to or received from the DUT are less than the round-trip-delay (RTD) from the tester drive/compare node to the DUT pin.

Similar problems result from other specialized DUT pins such as unexpectedly high or low voltage levels, and relatively fast or slow pattern rise-times. Thus, the key problem involves the inability for conventional testers to adapt to special DUT pins in a cost-effective and practical manner.

One conventional, and costly, technique for adapting a conventional tester to a modified DUT involves customizing the device-interface-board that mounts the DUT. Commonly referred to as a "loadboard", the custom DIB employs special circuitry permanently fixed to the DIB and controlled by the user to interface the special DUT pins to the tester. Although this solution permits testing of the DUT by the conventional tester, limitations on the area of the DIB limits the amount of custom circuitry that can be installed. Consequently, only a few specialized DUT pins may be supported with the loadboard technique. Additionally, the calibration between the custom circuitry on the loadboard and the tester becomes problematic since the DIB is typically fabricated and controlled by the user.

Therefore, the need exists for a tester having the capability of selectively testing specialized pins of a DUT without the burden of customizing respective DIBs. Moreover, the need exists for a remote test module that adapts a tester to a multitude of DUTs having varying specialized test requirements, without the need for separate testers. The remote test module of the present invention satisfies these needs.

SUMMARY OF THE INVENTION

The remote test module of the present invention provides a convenient interface to extend the usefulness of a tester beyond its originally designed purposes, and to adapt the tester to test DUT's having specialized pins in addition to normally expected pins. The invention enables users to avoid the undesirable costs associated with customizing DIBs, or even purchasing additional specialized testers. Moreover, because the invention is implemented with the tester, calibration and debugging time is significantly reduced.

To realize the foregoing advantages, the invention, in one form, comprises a remote test module for selectively interfacing a plurality of test channels between a tester interface and a plurality of specialized pins connected to a device-under-test. The tester interface is coupled to a test controller for generating predetermined test signals. The remote test module includes a signal conditioner responsive to the test controller for modifying the predetermined test signals into module test signals and applying the module test signals to the specialized pins of the device-under-test and a connection apparatus. The connection apparatus has a plurality of conductive paths for coupling the signal conditioner between the tester interface and the specialized pins.

In another form, the invention comprises an automatic test apparatus for coupling to a device-interface-board and applying and receiving test signals to and from a device-under-test. The device-under-test is mounted to the device interface board and includes specialized test pins. The automatic test apparatus includes a test controller having a main memory configured to store a plurality of master test signals and a tester interface. The tester interface is connected to the test controller for routing a majority of the master test signals to the device-interface-board. A remote test module interfaces the tester interface to the specialized test pins and includes a signal conditioner responsive to the test controller for applying the plurality of module test signals to the device-interface-board and a connection apparatus. The connection apparatus has a plurality of conductive paths for coupling the specialized channels to the signal conditioner and connecting to the device-interface-board.

In yet another form, the invention comprises a method of adapting an automatic test apparatus to a device interface board. The device interface board mounts a device-under-test. The device-under-test includes specialized pins for receiving specialized test signals. The method includes the steps of first selecting a remote test module having a signal conditioner for receiving test signals from the test controller and modifying the signals into the specialized signals; and interposing the remote test module between the tester interface and the device-interface-board to apply the specialized signals to the specialized pins.

A further form of the invention comprises a method of minimizing timing errors on high frequency signals controlled by a test controller. The signals comprise pulses of a predetermined minimum pulse width and applied to a plurality of specialized pins on a device-under-test. The device-under-test is disposed on a device-interface-board. The method includes the steps of first selecting a remote test module having a signal conditioner for multiplying the frequency of the test signals generated by the test controller; positioning the remote test module proximate the device-under-test; and interfacing the specialized device-under-test pins with the remote test module channels to establish round-trip-delay times less than the predetermined pulse widths.

Other features and advantages of the present invention will be apparent from the following detailed description when read in conjunction with the accompanying drawings.

DETAILED DESCRIPTION OF THE INVENTION

Semiconductor device manufacturers typically require all individual integrated circuit (IC) devices to undergo stringent functional tests to verify operability. The tests are usually performed at varying stages of manufacture, including mass testing at the wafer level, and individual testing at the final packaged level.

Figure 1:
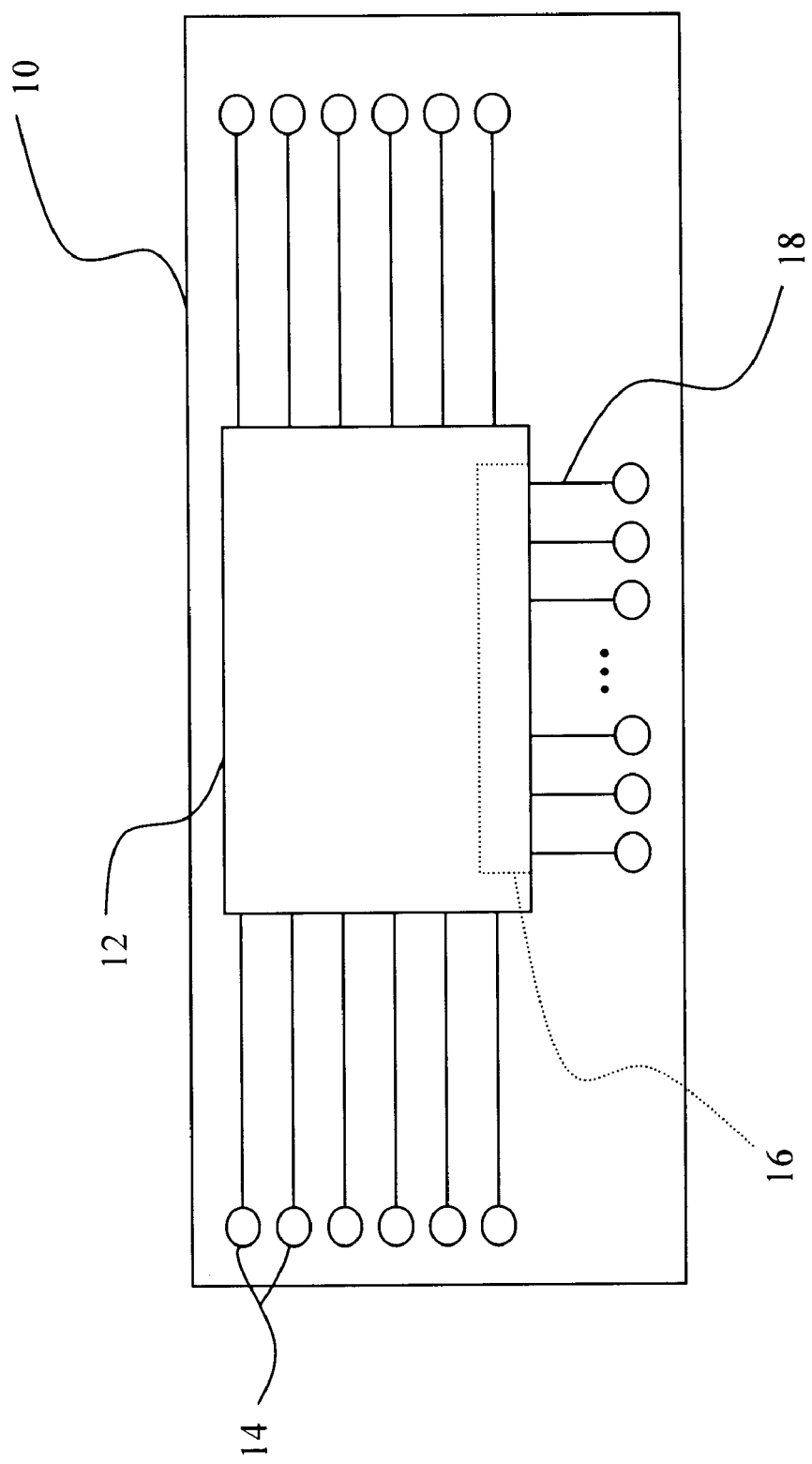
FIG. 1 is a block diagram of a user-controlled device-interface-board (DIB) for mounting a device-under-test (DUT)

Referring now to FIG. 1 in order to test individually packaged devices, the device manufacturer typically constructs a device-interface-board (DIB) 10 for mounting a device-under-test (DUT) 12. The DIB is usually user-controlled and includes contacts 14 for physically interfacing with the automatic test equipment ("tester") 20 (FIG. 2) employed to test the DUT. In some circumstances, the DUT includes circuitry, such as a thirty-channel high-speed Rambus interface 16, that requires specialized test parameters for a plurality of specialized DUT channels or pins 18.

Figure 2:
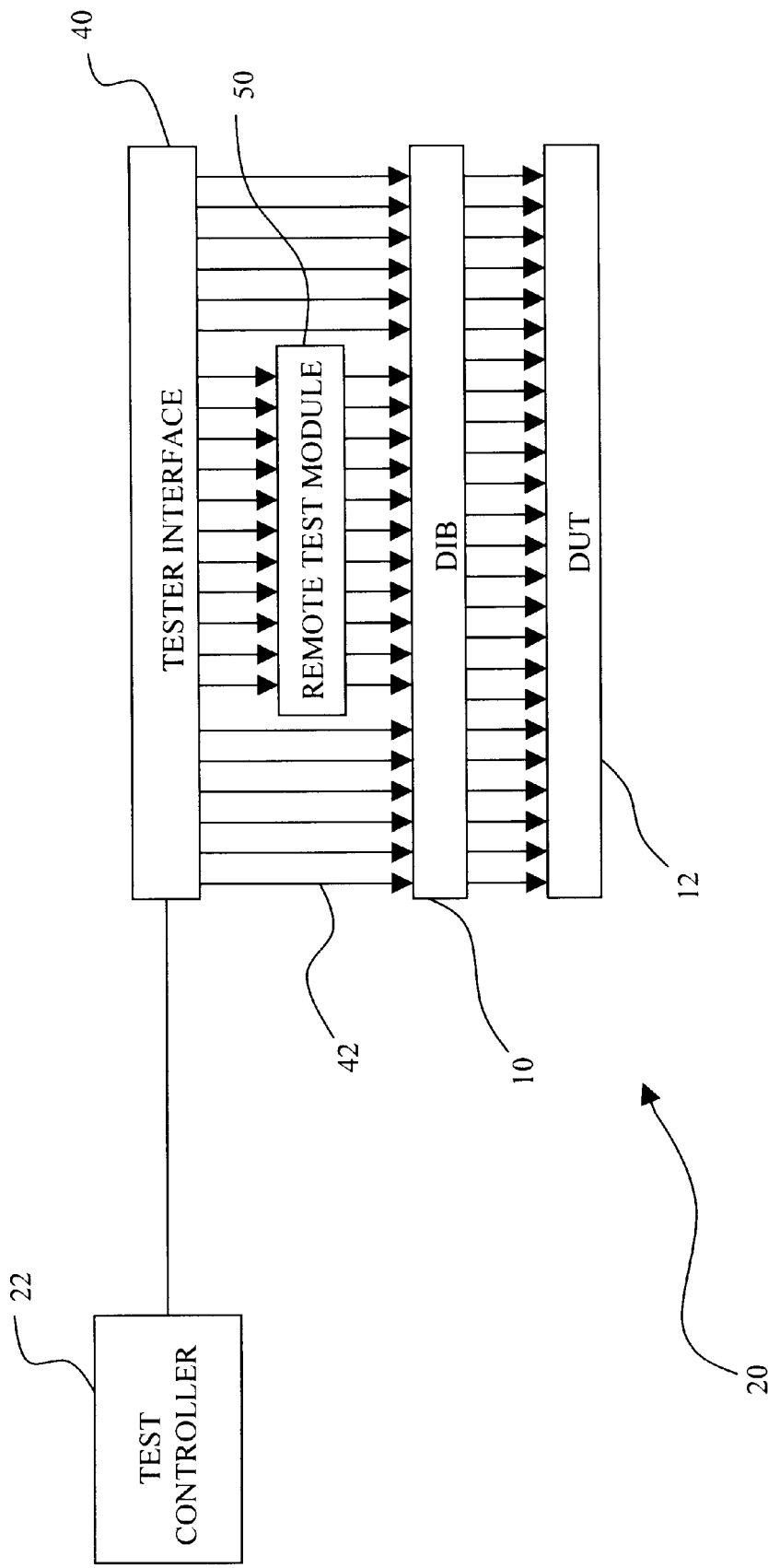
FIG. 2 is a block diagram of an automatic test apparatus according to one embodiment of the present invention.

Referring now to FIG. 2, a tester according to one embodiment of the present invention, generally designated 20, includes a test controller 22 and a tester interface 40 for coupling to a majority of the DIB contacts 14 (FIG. 1). Testers for testing both logic and/or memory devices are more fully described in U.S. Pat. Nos. 5,528,136 and 5,794,175, assigned to the assignee of the present invention and the disclosures of which are hereby expressly incorporated herein by reference. A remote test module 50 selectively couples predetermined test channels from the tester interface to the specialized DUT pins 18 (FIG. 1) to adapt the tester to specialized test applications without the need to customize the user-controlled DIB 10.

Figure 3:
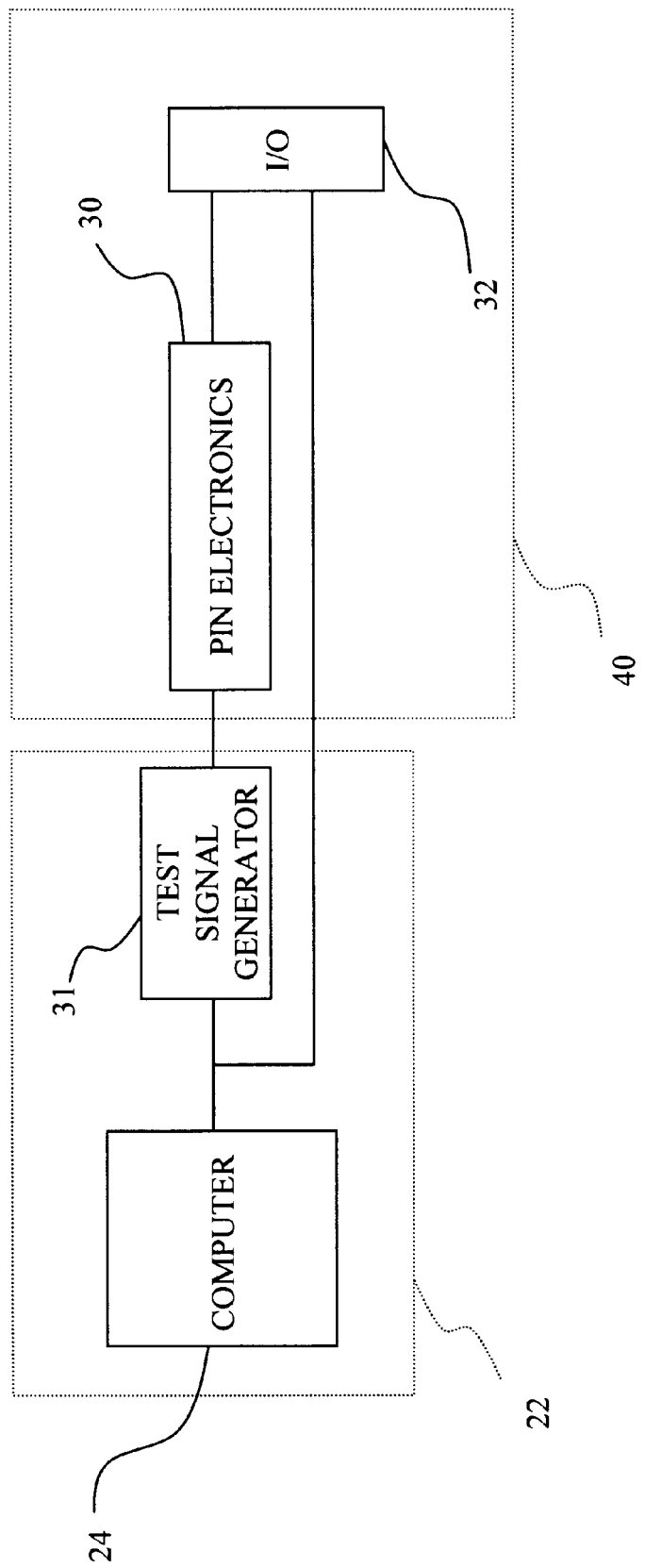
FIG. 3 is a block diagram of a test controller shown in FIG. 2.

With reference to FIGS. 2 and 3, the test controller 22 generally includes a computer that communicates with the user and runs user test programs. The computer controls a test signal generator 31 that generates waveforms for stimulating the DUT and verifying what the DUT outputs in response. Further referring to FIGS. 2 and 3, the tester interface 40 generally includes pin electronics 30 that generate and drive signal waveforms to the DUT 12 in response to commands and data from the test controller 22. The waveforms propagate along a plurality of channels or signal paths that terminate in respective input/output contact terminal array or pogo array 32. Each terminal is configured to physically couple to a corresponding contact on the DIB 10.

Figure 4:
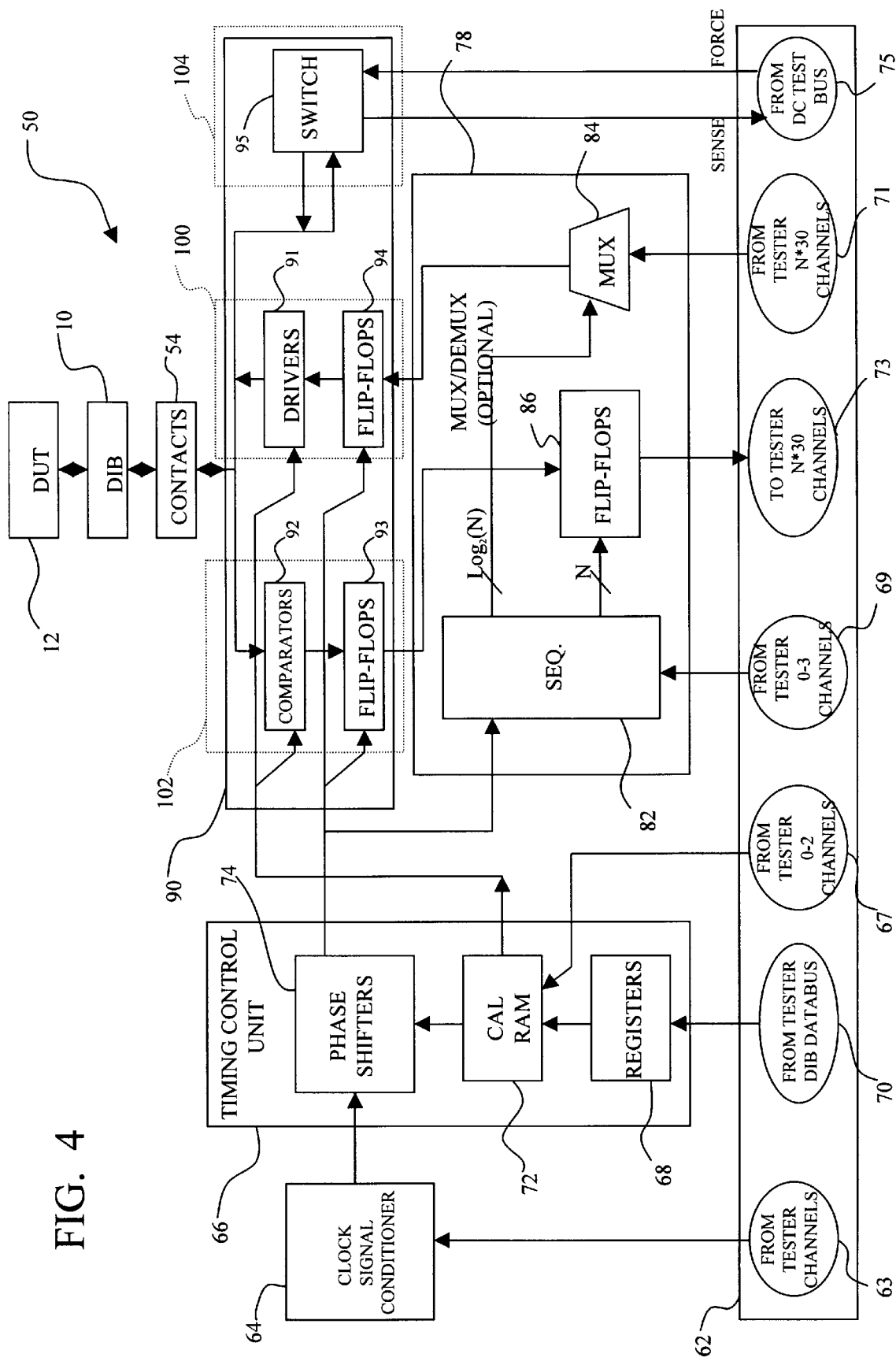
FIG. 4 is a block diagram of the remote test module of FIG. 2, according to one embodiment of the present invention.

Referring now to FIG. 4, the preferred detailed circuitry of the remote test module 50 includes a plurality of nodes 62 that comprise respective inputs from and outputs to the test controller 22. A clock node 63 feeds respective clock signals from the respective tester channels to a clock signal conditioner 64. The clock signal conditioner preferably comprises a phase locked oscillator or filter 64 that modifies the clock signal for subsequent application to the input of a timing control unit 66. The timing control unit preferably takes the form of an application specific integrated circuit (ASIC) and includes registers 68 for receiving data from a DIB databus node 70. A calibration RAM 72 is coupled to the outputs of the registers 68 and to the tester through node 67 to receive relevant data and timeset information. A group of phase shifters 74 receives information from the oscillator 64 and the calibration RAM 72 in order to maintain the calibrated clock(s) signal. The calibration RAM and the phase shifters provide information to a remote pin electronics interface 90 to keep it calibrated and accurate.

The remote pin electronics interface 90 includes respective drive, compare and DC test sections 100, 102 and 104 to monitor and control locally reclocked drive signals, monitor and control locally strobed comparisons, and effect DC switching functions, respectively. The drive section comprises a plurality of drivers 91 for applying reclocked signals originally generated by the tester to the DUT. The drivers are clocked by flip-flops 94 that are coupled to the clock signal conditioner 64 and are responsive to signals fed by a multiplexer 84. Reclocking the multiple drivers with a single clock source provides a more accurate set of test signals for application to the DUT.

The compare section 102 of the remote pin electronics interface 90 includes a plurality of comparators 92 having inputs coupled to the DUT outputs. The comparators perform a comparison of the expected DUT outputs to the actual DUT outputs to determine whether the particular DUT pin passed or failed. The comparator outputs are fed through a plurality of flip-flops 93 that are responsive to the clock signal conditioner 74 to reclock the comparator outputs. The reclocked outputs from the flip-flops may then be fed to the optional multiplexing/demultiplexing processor 78.

To effect DC parametric testing, the DC test section 104 of the remote pin electronics interface 90 includes a switching apparatus to disconnect the AC test components from the DUT while simultaneously coupling a DC test bus 75 to the DUT. The DC test bus sends a DC force signal along a force line FORCE, through the switching apparatus to the DUT, and receives the DUT response signal through a sense line SENSE. The DC test bus connects to a parametric measuring unit PMU (not shown) that evaluates the sensed signal.

The optional multiplexing/demultiplexing processor 78 is coupled to both the timing control unit 66 and the remote pin electronics interface 90, and receives test signals from the test controller 22 via nodes 69 and 71. Captured output signals from the DUT 12 are fed to the test controller through node 73. For example, tester channels 0–3, at node 69, are coupled to a sequencer 82 that responds to configuration commands from the test controller to control multiplexing and demultiplexing in the processor 78. The sequencer drives a multiplexer 84 that carries out the actual multiplexing of test vector signals.

For example, if the desired test speed is 800 MHz, and the test controller 22 is only capable of delivering test signals at the speed of 100 MHz, the sequencer 82 is instructed to multiplex 8 lines from the test controller to drive data along multiple channels to the DUT 12. This is achieved by setting the sequencer to configure the multiplexer 84 to an 8:1 ratio. Then, when the test signals are delivered to the multiplexer, the interleaved test signal output to the DUT interface 76 is 800 MHz. The drive section 100 of the remote pin electronics 90 applies these test signals to the DUT based on the calibrated clock and voltage level information from the timing control unit 66. The result will be a properly timed high speed test signal sequence to the DUT.

Additionally, the remote test module 50 captures output signals from the DUT 12. These signals are received and clocked through the compare section 102 of the remote pin electronics 90. If there are special sample times to sample the DUT outputs or a special sample sequence, the sequencer 82 may be programmed to set a plurality of flip-flops 86 to capture the signal at the special times or sequence. Additionally, the DUT outputs may also be too fast for the test controller 22, necessitating a demultiplexing step carried out by the flip-flops to reduce the signal speed and distribute the signal to a plurality of test controller terminals. For example, if the DUT data rate is 800 MHz and the test controller data rate is 100 MHz, the demultiplex ratio will be 1:8

In any of the described embodiments, the test controller 22 can simultaneously test the DUT 12 while the remote test module 50 tests the DUT. It is anticipated that this simultaneous test configuration is the best way to test a DUT having both slow speed and high speed test requirements. For example, the test controller can test those aspects of the DUT that are related to relatively slow speeds, and the remote test module can test those aspects of the DUT are related to relatively high speeds. In many electronic devices, power consumption is an issue, such as quiescent current IDDQ, and this can be tested with the test controller. However, other aspects such as data input and output rates require high speed testing and these features can be tested with the remote test module.

In one aspect of the invention, the remote test module 50 comprises a removeable unit that can be easily inserted and removed from between the tester interface contacts 42 and the DIB contacts 14 (FIG. 2). The remote test module is installed in very close proximity to the DUT 12, preferably within the range of about 1.5 to 4 inches, or short enough that reflections from imperfections in the transmission path settle to the required accuracy within one pulse width. This is an important parameter with respect to specialized high-speed testing. By minimizing the relative distance between the remote test module and the DUT, the signal round-trip-delay is less than the minimum pulse widths of about 3 ns, minus part of the rise-time such that the ringing/reflections from one edge settle out to the required accuracy before the next edge. This minimizes the timing errors caused by the reflections resulting from impedance mismatches. In this context, the present invention may be considered to have a form of impedance mismatch control.

Depending on the type of technology the DUT contains or what functions that the DUT is designed to perform, the remote test module can be custom loaded with module test signals or can be custom constructed with specific capabilities that are designed to test the specific DUT. Moreover, the remote test module is calibrated, diagnosed, loaded with a control program or loaded with test signals while installed on the tester. This makes the module an extension of the tester, rather than an extension of the DIB. Additionally, the ability to remove and replace the remote test module is beneficial because it allows a customer to substitute one remote test module for another, and the new configuration entered into the test controller 22. This feature reduces time to change the type of test that is performed on the DUT (e.g. module test signal test versus a multiplexed master test signal test). As a result, overall costs are significantly reduced.

Those skilled in the art will appreciate the many benefits and advantages afforded by the present invention. For example, an important advantage involves the minimal time delay between the ATE and the DUT. This is accomplished through the implementation of the remote test module. The module also enables high speed and highly accurate signal communication between the ATE and the DUT. Moreover, the remote test module provides a flexible tool for improving the ability to adapt a tester to a specialized device-under-test.

While the invention has been particularly shown and described with reference to the preferred embodiments thereof, it will be understood by those skilled in the art that various changes in form and detail may be made therein without departing from the spirit and scope of the invention. For example, while the remote test module has been described primarily in terms of high-speed applications, it is to be understood that the module may be constructed to interface between a tester interface and any DIB having a DUT requiring specialized testing. This may involve special test applications requiring relatively high or low voltages, or even relatively unique drive signal rise-times. Additionally, it is to be understood that the invention is not limited to testers adapted only for DIBs, but also to prober-type testers that test a plurality of devices in parallel at the wafer level. Further, although much of the terminology herein denotes logic tester applications, memory tester and mixed-signal applications are also within the intended scope of the present invention.

What is claimed is:

1. A remote test module for selectively interfacing a plurality of test channels between a test head and a plurality of specialized pins connected to a device-under-test, said test head having a tester interface coupled to a test controller for generating predetermined test signals, said remote test module including:

a signal conditioner responsive to said test controller for modifying said predetermined test signals into module test signals and applying said module test signals to said specialized pins of said device-under-test; and a connection apparatus having a plurality of conductive paths for coupling said signal conditioner between said tester interface and said specialized pins.

2. A remote test module according to claim 1 wherein:

said module test signals have predetermined minimum pulse widths; and said conductive paths have respective path lengths that establish round trip delay times between said signal conditioner and said device-under-test less than said predetermined minimum pulse widths.

3. A remote test module according to claim 2 wherein:

said conductive paths between said device-under-test and said module measure less than approximately 2 inches.

4. A remote test module according to claim 1 wherein:
said specialized pins comprise high speed inputs and outputs.

5. A remote test module according to claim 4 wherein:
said specialized pins comprise a Rambus interface.

6. A remote test module according to claim 1 wherein:
said signal conditioner includes a multi-channel accelerator for increasing the frequency of the signals applied to said specialized pins.

7. A remote test module according to claim 6 wherein:
said accelerator comprises a plurality of multiplexers having respective inputs of a first frequency and respective outputs interleaved to generate frequencies higher than said first frequency.

8. A remote test module according to claim 1 and further including:
calibration circuitry responsive to calibration commands from said test controller.

9. A remote test module according to claim 8 wherein said calibration circuitry includes:
a plurality of phase shifters to calibrate edge timing to and from said device-under-test.

10. A remote test module according to claim 9 wherein said calibration circuitry further includes:
a memory responsive to calibration signals from said test controller; and
said phase shifters are coupled to said memory and responsive to said calibration signals.

11. A remote test module according to claim 9 wherein:
said phase shifters are coupled to a clock source to receive a conditioned signal and operative to delay said conditioned clock signal.

12. An automatic test apparatus for coupling to a device-interface-board and applying and receiving test signals to and from a device-under-test, said device-under-test mounted to said device interface board and including specialized test pins, said automatic test apparatus including:
a test controller which generates a plurality of master test signals;
a test head including a tester interface connected to said test controller for routing a majority of said master test signals to said device-interface-board; and
a remote test module for interfacing said tester interface to said specialized test pins, said remote test module including
a signal conditioner responsive to said test controller for applying said plurality of module test signals to said device-interface-board and
a connection apparatus having a plurality of conductive paths for coupling said specialized test pins to said signal conditioner and connecting to said device-interface-board.

13. An automatic test apparatus according to claim 12 wherein:
said module test signals have predetermined minimum pulse widths; and
said conductive paths have respective path lengths that establish round trip delay times between said signal conditioner and said device-interface-board less than said predetermined pulse widths.

14. An automatic test apparatus according to claim 13 wherein:
said conductive paths between said device-under-test and said module measure less than approximately 2 inches.

15. An automatic test apparatus according to claim 12 wherein:
said specialized test pins comprise high speed pins.

16. An automatic test apparatus according to claim 15 wherein:
said specialized test pins comprise a Rambus interface.

17. An automatic test apparatus according to claim 12 wherein:
said signal conditioner includes a multi-channel accelerator for increasing the frequency of the signals applied to said specialized pins.

18. An automatic test apparatus according to claim 17 wherein:
said accelerator comprises a plurality of multiplexers having respective inputs of a first frequency and respective outputs interleaved to generate frequencies higher than said first frequency.

19. An automatic test apparatus according to claim 12 and further including:
calibration circuitry responsive to calibration commands from said test controller.

20. An automatic test apparatus according to claim 19 wherein said calibration circuitry includes:
a plurality of phase shifters to calibrate edge timing to and from said device-under-test.

21. An automatic test apparatus according to claim 19 wherein said calibration circuitry further includes:
a memory responsive to calibration signals from said test controller; and
said phase shifters are coupled to said memory and responsive to said calibration signals.

22. An automatic test apparatus according to claim 19 wherein:
said phase shifters are coupled to a clock source to receive a conditioned signal and operative to delay said conditioned clock signal.

23. A method of adapting a semiconductor tester test head having a tester interface to a device-under-test, said device-under-test including specialized pins for receiving specialized test signals, said method including the steps of:
selecting a remote test module having a signal conditioner for receiving test signals from said test controller and modifying said signals into said specialized signals; and
interposing said remote test module between said tester interface and said device-under-test to apply said specialized signals to said specialized pins.

24. A method of minimizing timing errors on high frequency signals controlled by a test controller, said high frequency signals comprising pulses of a predetermined minimum pulse width and applied to a plurality of specialized pins on a device-under-test, said method including the steps of:
selecting a remote test module having a signal conditioner for multiplying the frequency of said high frequency signals generated by said test controller, said signal conditioner having a plurality of channel outputs;
positioning said remote test module proximate said device-under-test; and
interfacing said specialized device-under-test pins with said remote test module channel outputs to establish round-trip-delay times less than said predetermined minimum pulse widths.

25. A remote test module for selectively interfacing a plurality of test channels between a tester interface and a plurality of specialized pins connected to a device-under-test, said tester interface coupled to a test controller for generating predetermined test signals, said remote test module including:

a signal conditioner responsive to said test controller for modifying said predetermined test signals into module test signals having predetermined minimum pulse widths and applying said module test signals to said specialized pins of said device-under-test; and a connection apparatus having a plurality of conductive paths for coupling said signal conditioner between said tester interface and said specialized pins, said conductive paths have respective path lengths that establish round trip delay times between said signal conditioner and said device-under-test less than said predetermined minimum pulse widths.

\* \* \* \* \*